US010656536B2

(12) United States Patent
Leenders et al.

(10) Patent No.: US 10,656,536 B2
(45) Date of Patent: May 19, 2020

(54) SUBSTRATE SUPPORT, METHOD FOR LOADING A SUBSTRATE ON A SUBSTRATE SUPPORT LOCATION, LITHOGRAPHIC APPARATUS AND DEVICE MANUFACTURING METHOD

(71) Applicants: ASML Netherlands B.V., Veldhoven (NL); ASML Holding N.V., Veldhoven (NL)

(72) Inventors: Martinus Hendrikus Antonius Leenders, Rhoon (NL); Niek Elout De Kruijf, Eindhoven (NL); Mircea Dusa, San Jose, CA (US); Martijn Houben, 's-Hertogenbosch (NL); Johannes Gerardus Maria Mulder, Eindhoven (NL); Thomas Poiesz, Veldhoven (NL); Marco Adrianus Peter Van Den Heuvel, Waalre (NL); Paul Van Dongen, Eindhoven (NL); Justin Johannes Hermanus Gerritzen, Eindhoven (NL); Antonie Hendrik Verweij, Dussen (NL); Abraham Alexander Soethoudt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 573 days.

(21) Appl. No.: 15/308,598

(22) PCT Filed: Apr. 23, 2015

(86) PCT No.: PCT/EP2015/058831
§ 371 (c)(1),
(2) Date: Nov. 2, 2016

(87) PCT Pub. No.: WO2015/169616
PCT Pub. Date: Nov. 12, 2015

(65) Prior Publication Data
US 2017/0192359 A1   Jul. 6, 2017

Related U.S. Application Data

(60) Provisional application No. 61/989,915, filed on May 7, 2014, provisional application No. 61/989,313, filed on May 6, 2014.

(51) Int. Cl.
*B25B 11/00* (2006.01)
*G03F 7/20* (2006.01)
*H01L 21/683* (2006.01)

(52) U.S. Cl.
CPC .......... *G03F 7/707* (2013.01); *G03F 7/70716* (2013.01); *G03F 7/70783* (2013.01); *H01L 21/6835* (2013.01); *H01L 21/6838* (2013.01)

(58) Field of Classification Search
CPC .. G03F 7/707; G03F 7/70716; G03F 7/70783; H01L 21/6835; H01L 21/6838
See application file for complete search history.

(56) References Cited

U.S. PATENT DOCUMENTS 4,737,824 A * 4/1988 Sakai ................. G03F 7/707
355/53
5,707,051 A    1/1998 Tsuji
(Continued)

FOREIGN PATENT DOCUMENTS

CN    101877303    11/2010
JP    S57-326269    2/1982
(Continued)

OTHER PUBLICATIONS

Japanese Office Action issued in corresponding Japanese Patent Application No. 2016-562030, dated Jun. 11, 2018.
(Continued)

*Primary Examiner* — Lee D Wilson

(74) *Attorney, Agent, or Firm* — Pillsbury Winthrop Shaw Pittman LLP

(57) ABSTRACT

A substrate support, includes: a substrate support location configured to support a substrate, and a vacuum clamping device configured to clamp the substrate on the substrate support location, wherein the vacuum clamping device includes at least one reduced pressure source to create a reduced pressure, at least one vacuum section connected to the at least one reduced pressure source, wherein the at least one vacuum section is configured to attract the substrate towards the substrate support location, and a control device configured to control a spatial pressure profile along the at least one vacuum section with which the substrate is attracted by the vacuum clamping device, wherein the control device includes a substrate shape data input to receive substrate shape data representing shape data of the substrate to be clamped, and wherein the control device is configured to adapt the spatial pressure profile in dependency of the substrate shape data.

20 Claims, 4 Drawing Sheets

(56) References Cited

U.S. PATENT DOCUMENTS

| | | | |
|---|---|---|---|
| 5,872,694 | A | 2/1999 | Hoinkis et al. |
| 6,762,826 | B2 * | 7/2004 | Tsukamoto ............ G03F 7/707 355/53 |
| 2007/0195306 | A1 | 8/2007 | Yun |
| 2009/0086187 | A1 | 4/2009 | Compen et al. |
| 2010/0277850 | A1 | 11/2010 | Chang et al. |
| 2012/0256087 | A1 | 10/2012 | Kanno et al. |
| 2013/0031768 | A1 * | 2/2013 | Kuit ................... G03F 7/70533 29/428 |
| 2013/0100572 | A1 | 4/2013 | Shu |
| 2013/0100573 | A1 | 4/2013 | Shu |

FOREIGN PATENT DOCUMENTS

| | | |
|---|---|---|
| JP | S61-105841 | 5/1986 |
| JP | S63-260129 | 10/1988 |
| JP | H06-196381 | 7/1994 |
| JP | H07-45692 | 2/1995 |
| JP | H07-58191 | 3/1995 |
| JP | H08-162390 | 6/1996 |
| JP | 2001-127144 | 5/2001 |
| JP | 2004-158610 | 6/2004 |
| JP | 2004-228453 | 8/2004 |
| JP | 2005-109358 | 4/2005 |
| JP | 2006-210372 | 8/2006 |
| JP | 2006-269867 | 10/2006 |
| JP | 2009-302149 | 12/2009 |
| JP | 2011-091070 | 5/2011 |
| JP | 2011-159655 | 8/2011 |
| JP | 2011-222578 | 11/2011 |
| JP | 2013-030677 | 2/2013 |
| JP | 2014-003259 | 1/2014 |
| JP | 2015-038982 | 2/2015 |
| KR | 10-2003-0028985 | 4/2003 |

OTHER PUBLICATIONS

International Search Report and Written Opinion dated Jul. 20, 2015 in corresponding International Patent Application No. PCT/EP2015/058831.
Japanese Office Action dated Aug. 24, 2017 in corresponding Japanese Patent Application No. 2016-562030.
Chinese Office Action dated Jul. 27, 2017 in corresponding Chinese Patent Application No. 201580022264.X.

* cited by examiner

SUBSTRATE SUPPORT, METHOD FOR LOADING A SUBSTRATE ON A SUBSTRATE SUPPORT LOCATION, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/058831, which was filed on Apr. 23, 2015, which claims the benefit of priority of U.S. provisional application Nos. 61/989,313 and 61/989,915, which were filed on May 6, 2014 and May 7, 2014, respectively, and which are incorporated herein in their entirety by reference.

FIELD

The present invention relates to a substrate support, a method for loading a substrate on a substrate support location, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus each substrate to be exposed, is loaded on a substrate support on which the substrate is supported during the exposure of a patterned beam of radiation. To clamp the substrate on the substrate support a clamping device is provided. In a known lithographic apparatus a vacuum clamping device is used as a clamping device. Such a vacuum clamping device provides a vacuum force with which the substrate is clamped on the supporting surface of the substrate support. In the case a substrate is straight, the substrate will be clamped on the support surface without any substantial internal stresses in the substrate.

However, substrates may not be straight, but for instance be warped in a number of shapes, such as a corrugated shape, a cylindrical shape, a dome shape, a saddle form or another shape. This may be caused by the production method used to make the substrate, or by pre- or post exposure processes to which the substrates are subjected during the manufacture.

When a warped substrate, for instance a dome-shaped substrate is clamped on a substrate support for instance by means of a vacuum clamp, the substrate may first contact with the substrate support at the outer circumference of the substrate and thereafter over the rest of the surface of the substrate. Due to the clamping force the substrate is forced into a substantially straight form, while the actual clamping starts at the outer circumference of the substrate. As a result stresses may be induced in the substrate when it is clamped on the supporting surface.

These stresses may have a negative influence on the quality of the integrated circuits. Also, since the substrate is clamped in another form than desired, the overlay performance of the projections of the lithographic apparatus may decrease which may have a negative influence on the quality of the integrated circuits.

It is remarked that US 2009/0086187 A1 discloses a substrate support comprising a clamping device configured to clamp a substrate on a substrate support location, wherein the clamping device comprises a first device to exert an attracting force on the substrate and a second device to exert a rejecting force on the substrate. This combination of a simultaneous attracting force and rejecting force should shape the substrate to a desired shape before clamping the substrate on the substrate support location.

SUMMARY

It is desirable to provide a substrate support having a substrate support location for substrates, wherein internal stresses in a substrate due to clamping forces are substantially decreased. Furthermore, it is desirable to provide a clamping method with which flat and warped substrates may be properly clamped on a substrate support thereby substantially decreasing the risk on stresses in the substrate and/or overlay errors.

According to an aspect of the invention, there is provided a substrate support, comprising:
  a substrate support location configured to support a substrate,
  a vacuum clamping device configured to clamp the substrate on the substrate support location, wherein the vacuum clamping device comprises:
    at least one reduced pressure source to create a reduced pressure,
    at least one vacuum section connected to the at least one reduced pressure source, wherein the at least one vacuum section is arranged and configured to attract the substrate towards the substrate support location, and
    a control device configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data.

According to an aspect of the invention, there is provided a method for loading a substrate on a substrate support location of a substrate support, comprising:
  providing a vacuum clamping device configured to clamp a substrate on the substrate support location, wherein the vacuum clamping device comprises:

at least one reduced pressure source to create a reduced pressure, at least one vacuum section connected to the at least one reduced pressure source, wherein the at least one vacuum section is arranged and configured to attract the substrate towards the substrate support location, providing a control device to control the vacuum clamping device, wherein the control device is configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data, controlling, using the control device, the spatial pressure profile in dependence of the substrate shape data between the substrate and the substrate support location, when the substrate is moved towards the substrate support location, and clamping the substrate at the substrate support location.

According to an aspect of the invention, there is provided a lithographic apparatus comprising substrate support, comprising:

a substrate support location configured to support a substrate, and a vacuum clamping device configured to clamp the substrate on the substrate support location, wherein the vacuum clamping device comprises:

at least one reduced pressure source to create a reduced pressure, at least one vacuum section connected to the at least one reduced pressure source, wherein the at least one vacuum section is arranged and configured to attract the substrate towards the substrate support location, and a control device to control the vacuum clamping device, wherein the control device is configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data.

According to an aspect of the invention, there is provided a device manufacturing method comprising transferring a pattern from, a patterning device onto a substrate, wherein the method comprises the steps of loading the substrate on a substrate support location of a substrate support before transferring the pattern, wherein said loading comprising:

providing a vacuum clamping device configured to clamp a substrate on the substrate support location, wherein the vacuum clamping device comprises:

at least one reduced pressure source to create a reduced pressure, at least one vacuum section connected to the at least one reduced pressure source, wherein the at least one vacuum section is arranged and configured to attract the substrate towards the substrate support location, providing a control device to control the vacuum clamping device, wherein the control device is configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data, controlling, using the control device, the spatial pressure profile in dependence of the substrate shape data between the substrate and the substrate support location, when the substrate is moved towards the substrate support location, and clamping the substrate at the substrate support location.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
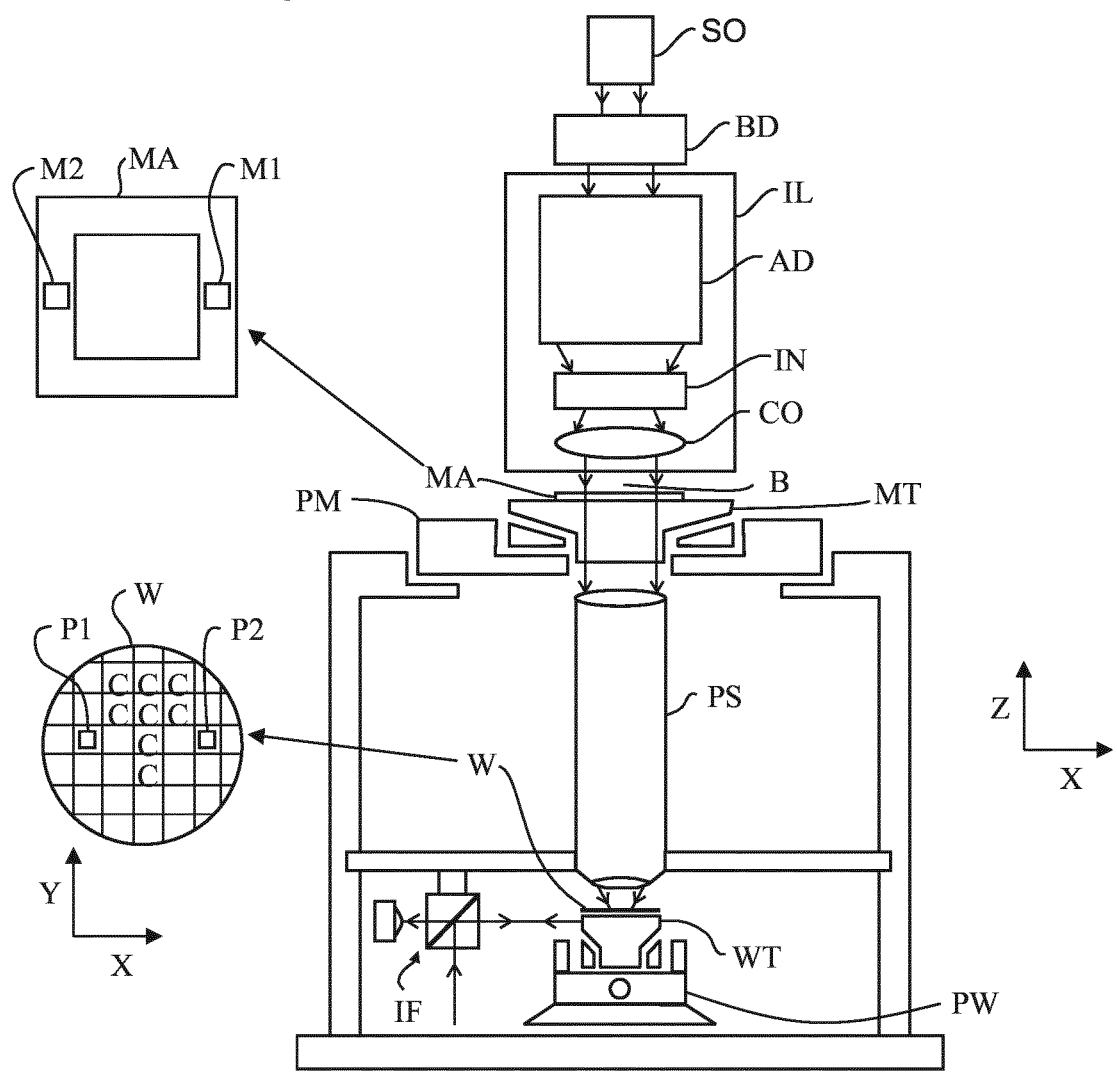
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

Figure 2:
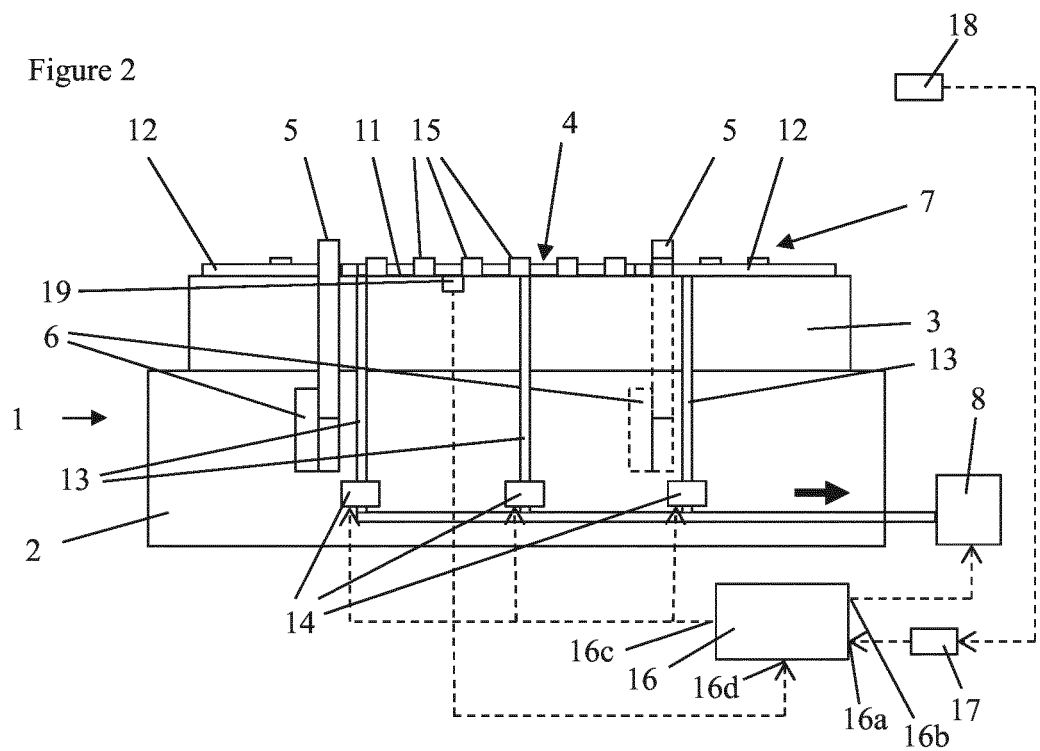
FIG. 2 depicts a side view of a substrate support according to the invention.
Figure 3:
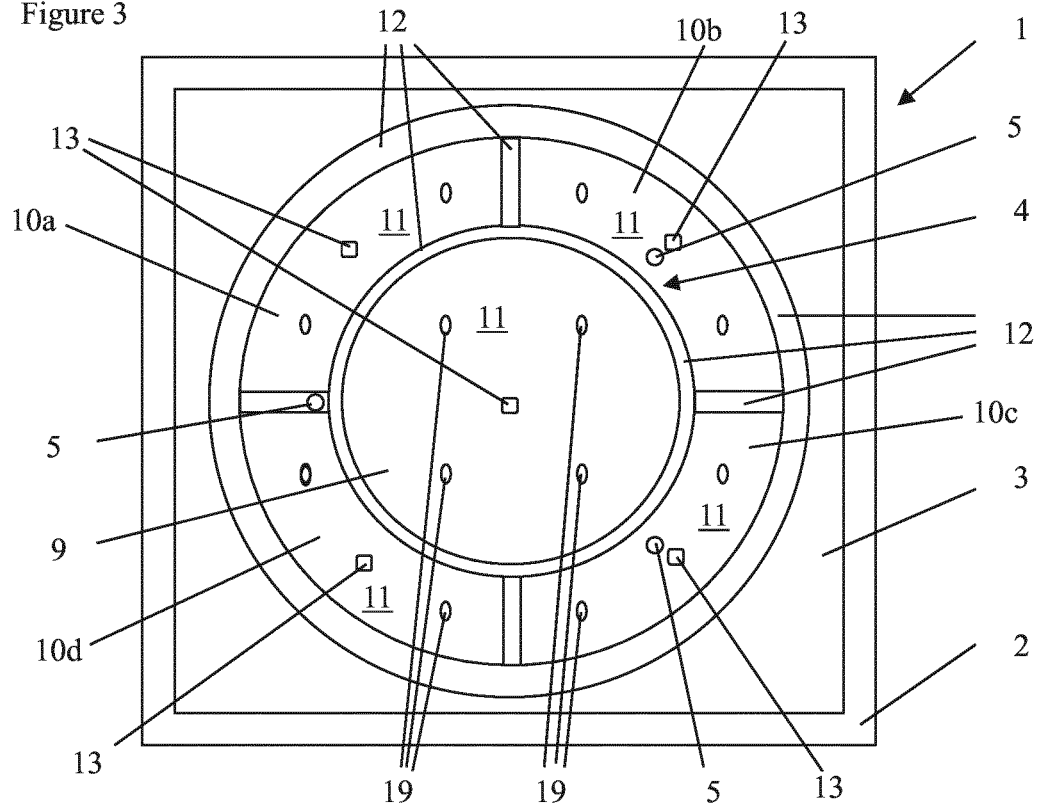
FIG. 3 depicts a top view of the substrate support of FIG. 2.

FIGS. 2 and 3 show a side view and a top view of a substrate support according an embodiment of the invention, respectively. The substrate support is generally indicated with the reference numeral 1. The substrate support 1 comprises a chuck 2 on which a substrate table 3 is placed. In an embodiment wherein a position of the chuck 2 is determined based on an interferometer position measurement system, the chuck 2 is in general referred to as mirror block. In an alternative embodiment where the position of the chuck 2 is determined based on an encoder position measurement system, the chuck 2 is generally referred to as encoder block. In a further alternative embodiment, the position of the chuck 2 may also be determined based on a suitable combination of an interferometer position measurement system and an encoder position measurement system, or by any other suitable position measurement system. The substrate table 3 defines a substrate support location 4 configured to support a substrate W.

The substrate support 1 further comprises three retractable support pins 5, often referred to as e-pins, which are movable with respect to the substrate support 1 between an extended support position in which the support pins 5 extend from the substrate support 1 and a retracted position in which the support pins 5 are retracted in the substrate support 1. Pin driving devices 6 are provided to drive the support pins between the extended position and the retracted position.

The support pins 5 are movable in a substantially vertical direction, i.e. in a direction substantially perpendicular to a main plane of a substrate W to be supported by the support pins 5. The support pins 5 may be used for transfer of a substrate W between the substrate support 1 and a robot or any other type of substrate handler. The support pins 5 are provided so that the robot may be placed under the substrate for supporting it. When the robot is configured to hold the substrate at the side edges of the substrate or alternatively to hold the substrate at the substrate top surface, the support pins 5 may be omitted.

If the support pins 5 are moved to the extended position, a robot can arrange a substrate W on the support pins 5. Then the support pins 5 may be moved to the retracted position so that the substrate comes to rest on the substrate support location 4 of the substrate support 1. After a substrate W supported by the substrate support 1 is exposed to a patterned beam of radiation, it may be exchanged for another one. For exchange of the substrate it is lifted from the substrate table 3 by the support pins 5 which are moved from the retracted position to the extended position. When the pins 5 are in the extended position, the substrate may be taken over by the robot or any other type of substrate handler.

The top side of the substrate support 1 comprises a vacuum clamping device 7 to clamp a substrate on the substrate support location 4. The vacuum clamping device 7 is configured to provide a reduced pressure with which the substrate W can be clamped on the substrate support location 4.

The vacuum clamping device 7 comprises a reduced pressure source 8, for example an air pump configured to pump air from the vacuum clamping device 7. The reduced pressure source 8 may be a local device only used for the vacuum clamping device 7 of the substrate support, but may also be a central source of reduced pressure of a lithographic apparatus, such as a central vacuum pump.

The vacuum clamping device 7 further comprises, at the substrate support location 4, a central vacuum section 9 and four vacuum sections 10a-10d distributed over the circumference of an annular area surrounding the central vacuum section 9. The central vacuum section 9 and the vacuum sections 10a-10d are formed by recessed surfaces 11 delimited by sealing rims 12, and provided to clamp the substrate W at the substrate support location 4.

Each vacuum section 9, 10a-10d is connected by at least one air suction conduit 13 to the reduced pressure source 8, such that air can be drawn out of the vacuum sections 9, 10a-10d. By drawing air out of the vacuum sections 9, 10a-10d, a vacuum space of the respective vacuum section 9, 10a-10d, delimited by the recessed surface 11, the sealing rim 12 and a substrate W placed or to be placed on the substrate support 1, can be used to create a vacuum force that attracts the substrate W.

In the air suction conduits 13 of the vacuum sections 9, 10a-10d adjustable restrictions 14, i.e. a restriction having an adjustable cross section area. Such an adjustable restriction 14 having an adjustable cross section area may for example be formed by valve devices arranged in each of the air suction conduits 13. These valve devices may for example be piezo valves comprising piezo actuators to adjust the cross section area of such adjustable restriction 14.

In the embodiment of FIG. 2, each of the vacuum sections 9, 10a-10d is connected by a single air suction conduit 13 to the reduced pressure source 8, and each vacuum section 9, 10a-10d is associated with its own adjustable restriction 14. In alternative embodiments, a single vacuum section 9, 10a-10d may have multiple air suction conduit connections to the reduced pressure source 8 and one or more adjustable restrictions 14 may be provided to control the level of reduced pressure in the vacuum sections 9, 10a-10d.

On the recessed surface 11 a number of burls 15 may be arranged, as shown in FIG. 2. The top ends of the burls 15 may provide support surfaces for a substrate to be placed on the substrate support 1. The sealing rims 12 and the top ends of the burls 15 may be arranged in substantially the same plane to provide a substantial flat surface for supporting a substrate. In an alternative embodiment the sealing rim 12 may be arranged lower than the burls 15, as shown in FIG. 2, or vice versa.

A control device 16 is provided to control the vacuum clamping device 7. The control device 16 comprises a control device input 16a connected to a storage device 17 comprising substrate shape data of a substrate W to be loaded on the substrate support 1. The storage device 17 may be connected to a sensor 18 with which shape data of the substrate W can be measured. Such sensor may for instance be a height level scanning sensor configured to determine a height level surface of the upper and/or lower surface of the substrate. Alternatively a grid of sensors may be used to measure the shape data of the substrate W. Examples of such grids include sensors placed in rings around the centre of the substrate, wherein the rings are being (equally) distributed in outer radial direction. An example of such a grid of sensors may include one central sensor and three rings comprising eight sensors wherein the rings are being equally distributed in view of the substrate area. Alternatively a grid of sensors may have more sensors as function of the radius (e.g. more sensors near the circumference of the substrate in comparison with the number of sensors near the middle of the substrate). Alternatively the substrate support 1 and the sensor (grid) are moved relatively to each other (in horizontal and/or rotational direction) to enable a more continuous measurement of substrate shape data.

The storage device 17 may also be fed with substrate shape data that is obtained from other sources. Typically, substrates from a batch of substrates within a certain process will each have a substantially corresponding shape after each specific process step. Also the substrate shape data of these typical shapes after a certain process step can be stored in the storage device 17 and used by the control device 16.

The storage device 17 may be any device capable of holding substrate shape data, such as a hard disk or computer memory. The control device 16 and the storage device 17 may be provided as separate devices, but may also be integrated in a single device.

It is remarked that instead of stored substrate shape data stored in a storage device, also substrate shape data of a substrate W can directly be fed into the control device 16.

The control device 16 comprises a control output 16b connected to the reduced pressure source 8 to control the reduced pressure provided by the reduced pressure source towards the air section conduits 13. The control device 16 also comprises control outputs 16c to each of the adjustable restrictions 14 to control the cross section areas of the respective adjustable restrictions 14.

By adjusting the cross section areas of the adjustable restrictions 14 and by controlling the reduced pressure provided by the reduced pressure source 8 to the air suction conduits 13, the spatial pressure profile provided by the vacuum clamping device 7 can be adapted to the shape of the substrate W to be clamped on the basis of the substrate shape data obtained from the storage device 17. In other words the spatial pressure profile created by the vacuum clamping device 7 can be adapted to the shape of the substrate W to be clamped on the basis of the substrate shape data provided by the storage device 17. The spatial pressure profile represents the spatial distribution of the vacuum force over the vacuum sections of the substrate support location.

The adaptation of the spatial pressure profile is desirable in order to clamp a substrate stress free and/or in a desired shape at the substrate support location 4. For example, it may be desired to clamp the substrate W on the substrate support location 4, when it is substantially flat during placement of the substrate W on the substrate support location 4. By controlling the spatial pressure profile on the basis of the substrate shape data such substantially flat substrate may be created and/or maintained during placement of the substrate W on the substrate support location 4.

Figure 4:
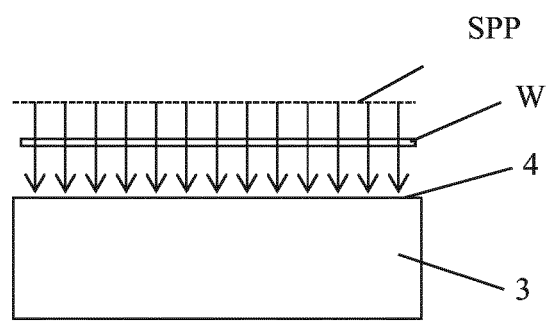
FIG. 4 depicts schematically loading of a flat substrate on a substrate support.

FIG. 4 shows the loading of a substantially flat, i.e. non warped substrate W on the substrate support location 4. The spatial pressure profile SPP is substantially uniform over the surface substrate W to evenly attract the substrate W towards the substrate support location 4. It is remarked that a uniform pressure profile does not necessarily needs to be the optimal spatial pressure profile SPP for a flat substrate W. For example, it may be possible that support of the substrate W on the support pins 5 may lead to sagging of the substrate W between the support pins 5. A non-uniform pressure profile may be used to compensate for this sagging.

Figure 5:
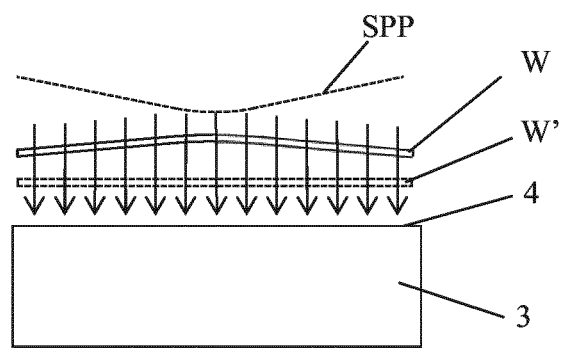
FIG. 5 depicts schematically loading of a warped substrate on a substrate support.

FIG. 5 shows the loading of a warped substrate W on the substrate support location 4. The spatial pressure profile SPP is not uniform over the substrate surface, but in the middle part where the substrate W is further spaced from the substrate support location, the pressure is lower such that this middle part is attracted with a larger vacuum force (indicated by arrows) towards the substrate support location 4 than outer parts of the substrate W which are closer to the substrate support location. As a result of this higher vacuum force in the middle part, the substrate W is straightened, as shown in dashed lines (substrate W'), such that the substrate is laid down on the substrate support location 4 in a substantially flat state.

It is remarked that generally to straighten a warped substrate, it is desirable to adapt the spatial pressure profile in dependence of the substrate shape data such that when a warped substrate is loaded in vertical downwards direction on a horizontal substrate support location 4, a vacuum force below the substrate parts spaced further away from the substrate support location is larger than a vacuum force below substrate parts closer by the substrate support location.

As described above substrate shape data is used to adapt the spatial pressure profile SPP created by the vacuum clamping device 7 in order to improve loading of the substrate W on a substrate support location. The control device 16 controls the reduced pressure source 8 in order to adjust the air flow drawn out of the air suction conduits 13 and the adjustable restrictions 14 to control the distribution of vacuum forces over the surface of the substrate support location 4.

In alternative embodiments, the control device 16 may only be configured to control the vacuum sections 9, 10a-10d using a constant pressure of the reduced pressure source 8.

Further, a control output of the control device 16 may also be connected to the pin driving devices 6, that are used to drive movements of the support pins 5 between the extended support position and the retracted position. When a substrate W supported on the support pins 5 is lowered, the air in the space between the substrate W and the substrate support location 4 has to be pushed out of this space in order to place the substrate W on the substrate support location 4. This air is partly taken away by the air sucked out of the vacuum sections 9, 10a-10d, but also leaves the space at the sides between the substrate W and the substrate support location 4. Thus, the movement of the support pins 5 has an influence on the pressures prevailing in the space between the substrate W and the substrate support location 4. Therefore, controlling by the control device 16 of the movement of the support pins 5, for example the speed of the movement, has direct influence on the spatial pressure profile SPP of the vacuum clamping device 7.

In addition to or alternatively to controlling the movement of the support pins 5, the control device 16 may control the reduced pressure source 8 in order to adjust the air flow drawn out of the air suction conduits 13 and the adjustable restrictions 14 time in dependency of an actual position of the support pins 5 during the wafer loading. The adjustable air flow may initially be set to a maximum flow (e.g. 8 NL/min) during the first part of loading the warped substrate W on the substrate support location 4, after which the air flow gradually or instantly can be set to a reduced flow-rate depending on the actual support pins position. The air flow may, for example, be set to a reduced flow-rate of 1 NL/min when the substrate W is near the substrate support location 4. This is beneficial as a constant maximum flow during the complete sequence of wafer loading may introduce undesired local stresses in the wafer W, whereas a constant reduced flow during the complete sequence of wafer loading requires a relative large time.

Alternatively or in addition, the control device 16 may act on a possible time-out during loading of the warped wafer W. If the warped wafer W cannot be clamped due to its warpage, the air flow drawn out of the air suction conduits 13 and the adjustable restrictions 14 can be increased gradually or in incremental steps. Under normal operating conditions the control device 16 may wait a pre-determined time interval for a downstream pressure sensor to reach a predetermined pressure level. If this predetermined pressure level cannot be reached within the pre-determined time interval, the control device 16 may set the reduced pressure source 8 to increase the air flow drawn out of the air suction conduits 13 and the adjustable restrictions 14. The reduced air flow may for example be set to a value of 0.5 NL/min, 1 NL/min, 1.5 NL/min, 2 NL/min or 4 NL/min, which value may be selected based on the level of warpage indicative for substrates from a batch of substrates within a certain process.

In addition to or as alternative to reduce the influence of the pressure prevailing in the space between the substrate W and the substrate support location 4, the burls 15 may be manufactured with an increased height such that the relative compression of air in the area between the warped wafer W and the support location 4 is reduced which enables an equivalent lower pressure build-up during wafer loading. Alternatively the burls 15 may remain their original height, but in the area between the burls 15 grooves are added into the substrate table 3 to increase the air volume between the substrate W and the substrate table 3. This is beneficial as it does not compromise the desired properties of the burls, while it enables an equivalent lower pressure build-up during wafer loading.

In an alternative embodiment the substrate table 3 is provided with air suction conduits 13 connected to the reduced pressure source 8 and provided with adjustable restrictions 14. During wafer loading the adjustable restrictions 14 are fully open, ensuring a large volume below the warped wafer W resulting in reduced air compression and a low air velocity (i.e. reduced pressure). As the warped wafer W is near the support location 4, the adjustable restrictions 14 are closed to reduce the enclosed volume between the warped wafer W and the support surface 4 to provide a reduced pressure with which the substrate W can be clamped on the substrate support location 4.

In the embodiment of FIGS. 2 and 3 a further possibility to control or improve the control of the spatial pressure profile of the vacuum clamping device 7 is shown. As shown in FIG. 3, four pressure sensors 19 are provided in the central vacuum section 9 and two pressure sensors 19 are provided in each of the vacuum sections 10a-10d. With the pressure sensors 19 the actual pressures in the vacuum sections 9, 10a-10d can be measured. As shown in FIG. 2 for one of the pressure sensors 19, the measured pressure can be fed via a pressure control input 16d into the control device 16, and this pressure data can be used to determine an actual spatial pressure profile SPP during the loading of a substrate on the substrate support location 4.

In such embodiment, the control device 16 comprises a feed forward device to feed forward substrate shape data in order to adapt the spatial pressure profile SPP to the specific shape of the respective substrate, and a feedback device using pressure sensors 19 which provides feedback on the actual pressures in the respective vacuum sections 9, 10a-10d. In an alternative embodiment in which shape data of the substrate W can be measured during loading of the substrate W on the substrate support 1, the feedback device could use this substrate shape data to control the vacuum clamping device 7.

Figure 6:
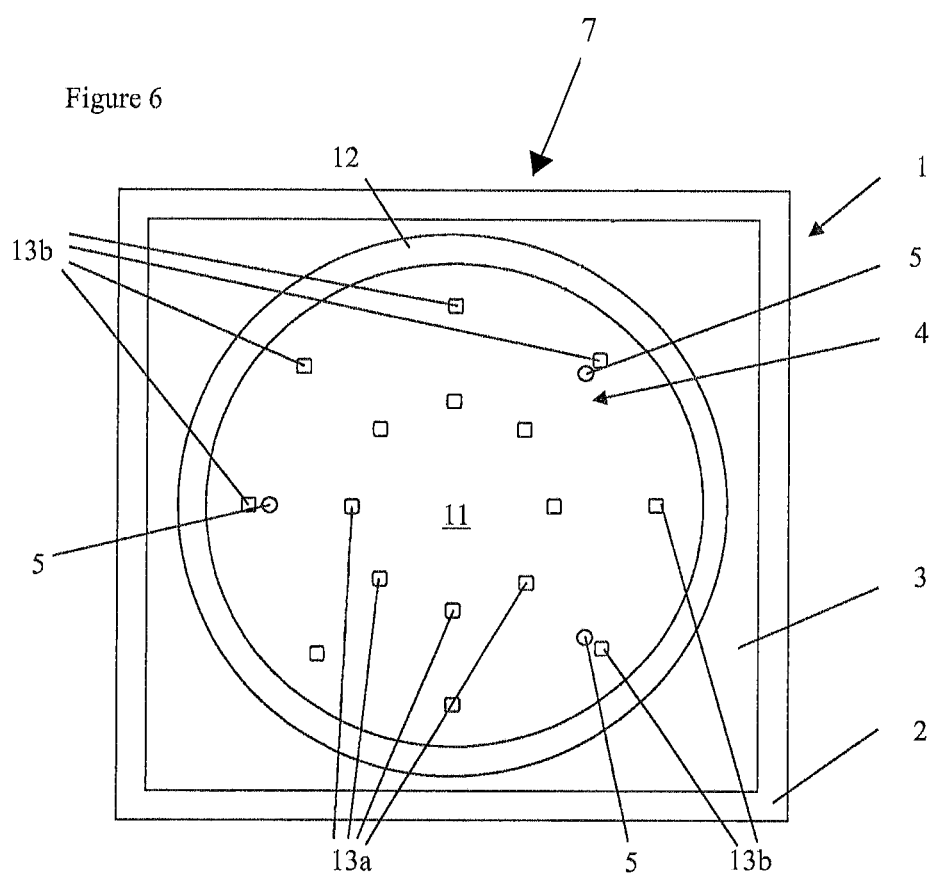
FIG. 6 depicts another embodiment of a substrate support according to the invention.

FIG. 6 shows an alternative embodiment of substrate support 1 comprising a vacuum clamping device 7 configured to control and adapt a spatial pressure profile SPP in dependence of the substrate shape data received by the control device 16. In this embodiment, there is a single annular sealing rim 12 at an outer edge of the substrate support location 4 and within this annular sealing rim 12, there is provided an inner ring with eight air suction conduits inlets 13a and an outer ring with eight air suction conduits inlets 13b. Each of the air suction conduits inlets 13a, 13b may be associated with its own adjustable restriction 14 such that the air flow through each of the air suction conduits inlets 13a, 13b can be individually controlled. Two or more air suction inlets 13a, 13b may be coupled to a single air suction conduit 13 in which an adjustable restriction 14 is provided.

The one or more air suction conduits inlets 13a, 13b of which the air flow individually or as a group can be controlled form a vacuum section of the vacuum clamping device 7. For example, the inner ring with eight air suction conduits inlets 13a may be used to form a central vacuum section and four groups of two air suction conduits inlets 13b may each form a vacuum section in the annular area surrounding the inner ring, i.e. corresponding to the configuration of FIG. 3.

Other configurations may also be made. For example one air suction inlet 13a of the inner ring and one air suction inlet 13b of the outer ring arranged at the same radius of the substrate support location 4 may be grouped to form a vacuum section. Also the air suction inlets 13a, 13b may be divided in four groups, each group covering one quarter of the circumference of the substrate support location 4.

It is remarked that the subdivision of vacuum sections as shown in the embodiment of FIGS. 2 and 3 having a central circular vacuum section 9 and four adjacent vacuum sections 10a-10d arranged in an annular area surrounding the circular vacuum section 9 is suitable to create pressure profiles for different substrate shapes, such as flat substrates and warped substrates having an umbrella shape, bowl shape, uni-axially bent shape, bi-axially bent shape or even higher order.

In an embodiment, there is provided a substrate support, comprising: a substrate support location configured to support a substrate, a vacuum clamping device configured to clamp the substrate on the substrate support location, wherein the vacuum clamping device comprises: at least one reduced pressure source to create a reduced pressure, at least one vacuum section connected to the at least one reduced pressure source, wherein the at least one vacuum section is arranged and configured to attract the substrate towards the substrate support location, and a control device configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data.

In an embodiment, the vacuum clamping device further comprises a substrate shape sensor to measure shape data of the substrate to be clamped, wherein an output of the substrate shape sensor provides substrate shape data of the measured substrate. In an embodiment, the substrate shape data is determined on the basis of substrate shape behavior associated with one or more process steps performed before loading of the substrate on the substrate support. In an embodiment, the vacuum clamping device further comprises at least one pressure sensor to measure a pressure level at the substrate support location, and wherein the control device comprises a pressure input to receive the pressure level at the substrate support location measured by the at least one pressure sensor. In an embodiment, the control device is configured to adapt the spatial pressure profile in dependency of the substrate shape data such that when a warped substrate is loaded on the substrate support in a vertical downwards direction, a vacuum force below substrate parts spaced further away from the substrate support location is larger than a vacuum force below substrate parts closer by the substrate support location. In an embodiment, the vacuum clamping device comprises multiple vacuum sections, wherein each of the multiple vacuum sections is arranged to attract with a vacuum force the substrate towards the substrate support location. In an embodiment, the vacuum clamping device comprises: a central vacuum section, an annular area surrounding the central vacuum section, the annular area comprising multiple vacuum sections distributed over the annular area. In an embodiment, the annular area comprises four vacuum sections, wherein each of the four vacuum sections is arranged in a different quarter of the circumference of the annular area. In an embodiment, each vacuum section comprises at least one pressure sensor to measure a pressure level in the respective vacuum section, and wherein the control device comprises a pressure control input to receive the pressure levels in the respective vacuum section measured by the at least one pressure sensor. In an embodiment, the vacuum clamping device is configured to create in each vacuum section an adjustable reduced pressure level, wherein the adjustable reduced pressure level is controlled by the control device. In an embodiment, each vacuum section is connected to the at least one reduced pressure source via at least one adjustable restriction, wherein at least one adjustable cross section area of the at least one adjustable restriction is adjustable, and wherein the at least one adjustable cross section area is controlled by the control device. In an embodiment, the at least one vacuum section is formed by a recessed surface surrounded by a rim to form a vacuum space in which a reduced pressure level can be created by the at least one reduced pressure source. In an embodiment, a number of burls are arranged on the recessed surface, the number of burls providing support surfaces for the substrate when clamped on the substrate support location. In an embodiment, the multiple vacuum sections are formed by recessed surfaces each surrounded and separated from each other by a rim to form a vacuum space in which a reduced pressure level can be created by the reduced pressure source. In an embodiment, the substrate support comprises multiple support pins, wherein the multiple support pins are movable between a support position in which the multiple support pins can support a substrate above the substrate support location, and a retracted position in which the multiple support pins are retracted below the substrate support location, and wherein the control device is configured to control a movement of the support pins at least between the support position and the retracted position, when a substrate is supported by the support pins in order to control the spatial pressure profile between the substrate and the substrate support location. In an embodiment, at least one reduced pressure source is controlled by the control device in dependency of an actual position of the support pins. In an embodiment, the substrate support comprises an additional vacuum clamping device configured to exert an additional clamping force on the substrate after the substrate has been placed at the substrate support location.

In an embodiment, there is provided a method for loading a substrate on a substrate support location of a substrate support, comprising: providing a vacuum clamping device configured to clamp a substrate on the substrate support location, wherein the vacuum clamping device comprises: at least one reduced pressure source to create a reduced pressure, at least one vacuum section connected to the at least one reduced pressure source, wherein the at least one vacuum section is arranged and configured to attract the substrate towards the substrate support location, providing a control device configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data, controlling, using the control device, the spatial pressure profile in dependence of the substrate shape data between the substrate and the substrate support location, when the substrate is moved towards the substrate support location, and clamping the substrate at the substrate support location.

In an embodiment, there is provided a lithographic apparatus comprising a substrate support, comprising: a substrate support location configured to support a substrate, and a vacuum clamping device configured to clamp the substrate on the substrate support location, wherein the vacuum clamping device comprises: at least one reduced pressure source to create a reduced pressure, at least one vacuum section connected to the at least one reduced pressure source, wherein the at least one vacuum section is arranged and configured to attract the substrate towards the substrate support location, and a control device configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data.

In an embodiment, there is provided a device manufacturing method comprising transferring a pattern from a patterning device onto a substrate, wherein the method comprises loading the substrate on a substrate support location of a substrate support before transferring the pattern, wherein the loading comprises: providing a vacuum clamping device configured to clamp a substrate on the substrate support location, wherein the vacuum clamping device comprises: at least one reduced pressure source to create a reduced pressure, at least one vacuum section connected to the at least one reduced pressure source, wherein the at least one vacuum section is arranged and configured to attract the substrate towards the substrate support location, providing a control device configured to control a spatial pressure profile along the at least one vacuum section with which the substrate is attracted by the vacuum clamping device, wherein the control device comprises a substrate shape data input to receive substrate shape data representing shape data of the substrate to be clamped, and wherein the control device is configured to adapt the spatial pressure profile in dependency of the substrate shape data, controlling, using the control device, the spatial pressure profile in dependence of the substrate shape data between the substrate and the substrate support location, when the substrate is moved towards the substrate support location, and clamping the substrate at the substrate support location.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. For example, the control device can include one or more processors and one or more storage devices encoded with machine executable instructions for performing the various tasks or procedures described above.

The descriptions above are intended to be illustrative, not limiting. Thus, it will be apparent to one skilled in the art that modifications and combinations of the embodiments may be made to the invention as described without departing from the scope of the claims set out below.

What is claimed is:

1. A substrate support system, comprising:
   a vacuum clamping apparatus of a substrate support, the vacuum clamping apparatus configured to clamp a substrate on a substrate support location, wherein the vacuum clamping apparatus comprises one or more vacuum sections connected or connectable to a reduced pressure source, and wherein the one or more vacuum sections are arranged and configured to attract the substrate towards the substrate support location; and
   a control device configured to control a spatial pressure profile along the one or more vacuum sections with which the substrate is attracted by the vacuum clamping apparatus, wherein the control device comprises a substrate shape data input to receive substrate shape data representing shape data of the substrate to be clamped, the control device is configured to adapt the spatial pressure profile in dependency of the substrate shape data, and the control device is configured to cause the one or more vacuum sections to apply a reduced pressure on the basis of the adapted spatial pressure profile at least during a period prior to the substrate physically contacting the substrate support location.

2. The substrate support system of claim 1, wherein the vacuum clamping apparatus further comprises a substrate shape sensor to measure shape data of the substrate to be clamped, wherein an output of the substrate shape sensor provides substrate shape data of the measured substrate.

3. The substrate support system of claim 1, wherein the substrate shape data is associated with a process step performed before loading of the substrate on the substrate support.

4. The substrate support system of claim 1, wherein the vacuum clamping apparatus further comprises a pressure sensor to measure a pressure level at the substrate support location, and wherein the control device comprises a pressure input to receive the pressure level at the substrate support location measured by the pressure sensor.

5. The substrate support system of claim 1, wherein the control device comprises instructions, that when executed by a processor system, are configured to adapt the spatial pressure profile in dependency of the substrate shape data such that when a warped substrate is loaded on the substrate support in a vertical downwards direction and when the one or more vacuum sections apply the reduced pressure on the basis of the spatial pressure profile, a vacuum force below substrate parts spaced further away from the substrate support location is larger than a vacuum force below substrate parts closer by the substrate support location.

6. The substrate support system of claim 1, wherein the one or more vacuum sections comprise multiple vacuum sections, wherein each vacuum section of the multiple vacuum sections is arranged to attract with a vacuum force the substrate towards the substrate support location.

7. The substrate support system of claim 6, wherein the one or more vacuum sections comprise:
   a central vacuum section, and
   multiple vacuum sections distributed over an annular area, the annular area surrounding the central vacuum section.

8. The substrate support system of claim 7, wherein the multiple vacuum sections distributed over the annular area comprise four vacuum sections, wherein each vacuum section of the four vacuum sections is arranged in a different quarter of a periphery of the annular area.

9. The substrate support system of claim 6, wherein each vacuum section comprises a pressure sensor to measure a pressure level in the respective vacuum section, and wherein the control device comprises a pressure control input to receive the pressure levels in the vacuum sections measured by the respective pressure sensors.

10. The substrate support system of claim 6, wherein the control device comprises instructions, that when executed by a processor system, are configured to control the vacuum clamping apparatus to create in each vacuum section an adjustable reduced pressure level.

11. The substrate support system of claim 10, wherein each vacuum section is connected or connectable to the reduced pressure source via a respective adjustable restriction, wherein a respective adjustable cross section area of each of the adjustable restrictions is adjustable, and wherein the adjustable cross section areas are controlled by the control device.

12. The substrate support system of claim 1, wherein the one or more vacuum sections are formed by a recessed surface surrounded by a rim to form a space in which a reduced pressure level can be created by the reduced pressure source.

13. The substrate support system of claim 12, wherein a number of burls are arranged on the recessed surface, the number of burls providing support surfaces for the substrate when clamped on the substrate support location.

14. The substrate support system of claim 6, wherein the multiple vacuum sections are formed by recessed surfaces each surrounded and separated from each other by a rim to form a space in which a reduced pressure level can be created by the reduced pressure source.

15. The substrate support system of claim 1, wherein the substrate support comprises multiple support pins, wherein the multiple support pins are movable between a support position in which the multiple support pins can support the substrate above the substrate support location, and a retracted position in which the multiple support pins are retracted below the substrate support location, and wherein the control device is configured to control a movement of the support pins at least between the support position and the retracted position, when a substrate is supported by the support pins in order to control the spatial pressure profile between the substrate and the substrate support location.

16. The substrate support system of claim 15, wherein the reduced pressure is controlled by the control device in dependency of an actual position of the support pins.

17. A method comprising:
providing a vacuum clamping apparatus configured to clamp a substrate on a substrate support location of a substrate support, wherein the vacuum clamping apparatus comprises one or more vacuum sections connected to a reduced pressure source, wherein the one or more vacuum sections are arranged and configured to attract the substrate towards the substrate support location,
providing a control device configured to control a spatial pressure profile along the one or more vacuum sections with which the substrate is attracted by the vacuum clamping apparatus, wherein the control device comprises a substrate shape data input to receive substrate shape data representing shape data of the substrate to be clamped, and wherein the control device is configured to adapt the spatial pressure profile in dependency of the substrate shape data,
causing, using the control device, the one or more vacuum sections to apply a reduced pressure on the basis of the adapted spatial pressure profile between the substrate and the substrate support location at least during a period prior to the substrate physically contacting the substrate support location, and
clamping the substrate at the substrate support location.

18. A lithographic apparatus comprising:
a vacuum clamping apparatus of a substrate support, the vacuum clamping apparatus configured to clamp a substrate on a substrate support location, wherein the vacuum clamping apparatus comprises one or more vacuum sections arranged and configured to attract the substrate towards the substrate support location;
a control device configured to control a spatial pressure profile along the one or more vacuum sections with which the substrate is attracted by the vacuum clamping apparatus, wherein the control device comprises a substrate shape data input to receive substrate shape data representing shape data of the substrate to be clamped, the control device is configured to adapt the spatial pressure profile in dependency of the substrate shape data, and the control device is configured to cause the one or more vacuum sections to apply a reduced pressure on the basis of the spatial pressure profile at least during a period prior to the substrate physically contacting the substrate support location; and
a pattern transfer apparatus configured to transfer a pattern onto the substrate when located at the substrate support location.

19. A manufacturing method comprising:
loading a substrate onto a substrate support location of a substrate support, wherein the substrate support comprises a vacuum clamping apparatus configured to clamp the substrate on the substrate support location, the vacuum apparatus comprising one or more vacuum sections connected to a reduced pressure source, wherein the one or more vacuum sections are arranged and configured to attract the substrate towards the substrate support location,
generating a spatial pressure profile for application along the one or more vacuum sections, based on substrate shape data representing shape data of the substrate to be clamped,
causing the one or more vacuum sections to apply a reduced pressure on the basis of the spatial pressure profile between the substrate and the substrate support location at least during a period prior to the substrate physically contacting the substrate support location,
clamping the substrate at the substrate support location, and
physically processing the substrate located on the substrate support location.

20. The method of claim 19, wherein the physically processing the substrate comprises transferring a pattern from a patterning apparatus onto the substrate.

* * * * *